United States Patent
Pandya et al.

(10) Patent No.: US 10,473,704 B2
(45) Date of Patent: Nov. 12, 2019

(54) MIXED MODE VECTOR NETWORK ANALYSER

(71) Applicant: INSPIRAIN TECHNOLOGIES PTE LTD., Singapore (SG)

(72) Inventors: Harshang Nileshkumar Pandya, Singapore (SG); Arvindbhai Chimanbhai Patel, Singapore (SG)

(73) Assignee: INSPIRAIN TECHNOLOGIES PTE LTD, Singapore (SG)

( * ) Notice: Subject to any disclaimer, the term of this patent is extended or adjusted under 35 U.S.C. 154(b) by 375 days.

(21) Appl. No.: 15/444,783

(22) Filed: Feb. 28, 2017

(65) Prior Publication Data

US 2018/0246153 A1    Aug. 30, 2018

(51) Int. Cl.
*G01R 27/28* (2006.01)
*G01R 27/06* (2006.01)
*G01R 27/32* (2006.01)

(52) U.S. Cl.
CPC ............. *G01R 27/28* (2013.01); *G01R 27/06* (2013.01); *G01R 27/32* (2013.01)

(58) Field of Classification Search
CPC ......... G01R 27/32; G01R 27/06; G01R 27/28
USPC .. 324/500, 520–524, 750.01, 600, 612, 616, 324/629, 638–650, 76.11, 216
See application file for complete search history.

(56) References Cited

U.S. PATENT DOCUMENTS

| 2002/0053899 | A1  | 5/2002  | Adamian et al. |
| 2004/0227580 | A1  | 11/2004 | Otsuka et al. |
| 2005/0138577 | A1  | 6/2005  | Adamian |
| 2008/0204041 | A1* | 8/2008  | Anderson ............. G01R 27/04 324/629 |

(Continued)

FOREIGN PATENT DOCUMENTS

| EP | 1061660 A1 | 12/2000 |
| JP | 2002323524 A | 11/2002 |
| JP | 2017015450 A | 1/2017 |

OTHER PUBLICATIONS

Rohde & Schwarz, "R&S® ZVA Vector Network Analyzer High performance up to 110 GHz with up to four test ports", (Mar. 1, 2014), URL: https://cdn.rohde-schwarz.com/pws/dl_downloads/dl_common_library/dl_brochures_and_datasheets/pdf_1/ZVA_bro_en_5213-5680-12_v1001.pdf.

(Continued)

*Primary Examiner* — Melissa J Koval
*Assistant Examiner* — Trung Nguyen
(74) *Attorney, Agent, or Firm* — Tarolli, Sundheim, Covell & Tummino LLP

(57) ABSTRACT

A mixed mode vector network analyzer (VNA) system to measure S-parameters and DC parameters of a differential device under test (DUT) is provided. The mixed mode VNA system measures mixed mode S-parameter measurements (i.e., AC measurements) using an independent resistive reflectometer bridge connected to each of the two ports of the differential DUT. The mixed mode VNA system further (Continued)

measures DC parameters of the differential DUT without impacting the measurement of S-parameters. In one embodiment, the mixed mode VNA system is used to measure multi-port differential DUT. Coupling capacitors provide low enough impedance to even the smallest RF frequency of AC measurement (i.e., measurement of S-parameters).

20 Claims, 8 Drawing Sheets

(56) References Cited

U.S. PATENT DOCUMENTS

2010/0204943 A1\* 8/2010 Heuermann ........... G01R 27/32 702/85

OTHER PUBLICATIONS

Keysight, "Keysight Technologies PNA-X Series Microwave Network Analyzers", (May 7, 2015), URL: https://web.archive.org/web/20150529003521/http://literature.cdn.keysight.com/litweb/pdf/5990-4592EN.pdf.

Guus Colman et al, "DC-coupled directional bridge front-end for vector network analyzer receiver in GHz-range," IEICE Electronics Express, (Jun. 10, 2011), vol. 8, No. 11, doi:10.1587/elex.8.814, pp. 814-818.

Anritsu, "Application Note Understanding Directivity Vector Network Analyzer Measurements Models 37000X, MS4620X Lightning (TM) and Scorpion (TM) Vector Network Analyzer", (Mar. 1, 2008), URL: http://www2.electron.frba.utn.edu.ar/~jcecconi/Bibliografia/03%20-%20Medicion%20de%20Potencia%20en%20RF%20y%20micro-ondas/Anritsu_Understanding_Directivity.pdf.

Bockelman D E et al, "Combined Differential and Common-Mode Scattering Parameters: Theory and Simulation", IEEE Transactions on Microwave Theory and Techniques, Plenum, USA, (Jul. 1, 1995), vol. 43, No. 7, doi:10.1109/22.392911, ISSN 0018-9480.

European Search Report for Application No. 18159118.1-1022 dated Aug. 16, 2018.

\* cited by examiner

MIXED MODE VECTOR NETWORK ANALYSER

BACKGROUND

Technical Field

The embodiments herein generally relate to a vector network analyzer (VNA), and, more particularly, a mixed mode vector network analyzer system to measure S-parameters and DC parameters of a device under test (DUT).

Description of the Related Art

Balanced transmission lines are finding extensive adoption in high-speed, short reach data connectivity applications due to the inherent noise immunity and low cost. For e.g., the twisted pair cabling systems are balanced transmission lines. The need and importance of characterizing the signal carrying capacity and noise immunity of the channels of the balanced transmission lines significantly increase with the rapid growth in data transmission speeds. Vector Network Analyzers (VNA) are essential for characterizing RF transmission parameters of communications channels.

The balanced transmission lines systems being characterized are specified as a DUT (Device Under Test). To characterize a multiport balanced DUT, a VNA with a large number of ports is necessary. The cost of traditional VNAs increases rapidly with the number of test ports. Additionally, complex test fixtures are necessary to connect balanced DUTs to traditional VNAs. As balanced DUTs have useful frequency range well below 10 GHz, they do not need the high bandwidth of the traditional VNAs, which typically is a few tens of GHz. Because of these factors, traditional VNAs can become prohibitively expensive for large scale characterization of balanced DUTs in the laboratories as well as manufacturing floors. Further, in many applications, two ends of a DUT, such as a twisted pair cabling channel, while the two ends are far apart (not co-located) is necessary to be characterized. In such case, two VNAs, each connected to one end of the DUT, are needed to synchronize in performing characterization including near-end and far-end parameters from both ends. The traditional VNAs do not provide convenient way to characterize such dual ended DUTs.

Accordingly, there remains a need for a mixed mode VNA for characterizing balanced DUTs in an accurate, simple, and cost-effective way.

SUMMARY

In view of the foregoing, an embodiment herein provides a mixed mode vector network analyzer (VNA) system to measure S-parameters and DC parameters of a differential device under test (DUT). The mixed mode vector network analyzer system includes a differential transmitter, a first reflectometer, a second reflectometer, a first ground port, a second ground port, a first receiver, a second receiver, a first DC measurement circuit, a second DC measurement circuit, a first DC source, a second DC source, a first coupling capacitor, a second coupling capacitor, and the differential DUT. The differential transmitter further includes a first transmitter port, and a second transmitter port. The first transmitter port is coupled to a first DUT port of the differential DUT through the first reflectometer. The second transmitter port is coupled to a second DUT port through the second reflectometer. The first transmitter port is configured to provide in-phase excitation signals to the first DUT port. The second transmitter port is configured to provide 180° out-phase excitation signals to the second DUT port.

The first ground port of the first reflectometer is connected to the circuit ground point via the first coupling capacitor. The second ground port of the second reflectometer is connected to the circuit ground point via the second coupling capacitor. In one embodiment, the first ground port and the second ground port is an AC ground. In another embodiment, the first reflectometer and the second reflectometer is a resistive Wheatstone reflectometer bridge. The first receiver is coupled to a measurement port of the first reflectometer. The second receiver is coupled to a measurement port of the second reflectometer. The first DC measurement circuit is coupled to a first switch and the first ground port of the first reflectometer. The first switch either connects to the first DC source or a first current measurement unit that provides low resistance path to the circuit ground point. The second DC measurement circuit is coupled to a second switch and the second ground port of the second reflectometer. The second switch either connects to a second DC source or a second current measurement unit that provides low resistance path to the circuit ground point. In one embodiment, the first DC measurement circuit and the second DC measurement is an ADC. The DC source is configured to provide DC excitation to the differential DUT.

In one embodiment, the first receiver and the second receiver is configured to measure S parameters of the differential DUT. In another embodiment, the first DC measurement circuit and the second DC measurement circuit is configured to measure DC parameters of the differential DUT. In one embodiment, the first reflectometer is configured to provide an output signal, on the first receiver, corresponding to a received signal from the first DUT port of the differential DUT. In another embodiment, the second reflectometer is configured to provide an output signal, on the second receiver, corresponding to a received signal from the second DUT port of the differential DUT. In one embodiment, a common mode S parameter and differential mode S parameter is calculated using the measurements of the output signal on the first receiver and the second receiver.

In one embodiment, the first DC measurement circuit and the second DC measurement circuit is configured to measure resistance of each conductor of the differential DUT. In another embodiment, a first end of the each conductor of the differential DUT is connected to a voltage source or a current meter through a switch and the second end of the each conductor of the differential DUT is connected to a common point through a fixed resistor. In one embodiment, the current meter provides a connection to the circuit ground through a fixed resistor. In an embodiment, the first coupling capacitor and the second coupling capacitor are configured to (i) block RF signals from the differential DUT when measuring DC parameters at the first DC measurement circuit and the second DC measurement circuit, and (ii) provide ground potential when measuring S parameters at the first receiver and the second receiver. In an embodiment, the resistive nature of the reflectometer bridge provides necessary conductive path for the DC measurement unit to the DUT. In an embodiment, the first coupling capacitor, the second coupling capacitor, the first resistive reflectometer, and the second resistive reflectometer enable the measurements of S-parameters and DC parameters without impairing each other.

In another embodiment, a multi-port DUT comprises more than one differential port. In an embodiment, a dual-ended DUT comprises a differential port with two ends. In one embodiment, one or more mixed mode VNA system is configured to measure S-parameters of a multi-port dual-end differential device under test (DUT). The multi-port dual-end differential DUT includes one or more differential ports at a first end and more than one differential ports at a second end. The first end and the second end are coupled in opposite side of the multi-port dual-end differential DUT. In one embodiment, the first end of the multi-port dual-end differential DUT includes a first differential DUT port and a second differential DUT port. The second end of the multi-port dual-end differential DUT comprises a third differential DUT port and a fourth differential DUT port. The first end of the multi-port dual-end differential DUT is coupled to a first mixed mode VNA system to measure S-parameters at the first end of the multi-port dual-end differential DUT. The second end of the multi-port dual-end differential DUT is coupled to a second mixed mode vector network analyzer system to measure S-parameters at the second end of the multi-port dual-end differential DUT.

When the differential transmitter provides differential excitation signals to the first differential DUT port of the first end, (i) the first differential DUT port of the first end of the multi-port dual-end differential DUT provides reflection measurements, (ii) the second differential DUT port of the first end of the multi-port dual-end differential DUT provides near-end crosstalk measurements, (iii) the third differential DUT port of the second end of the multi-port dual-end differential DUT provides attenuation measurements, and (iv) the fourth differential DUT port of the second end of the multi-port dual-end differential DUT provides far-end crosstalk measurements. When the differential transmitter provides differential excitation signals to the second differential DUT port of the first end, (i) the first differential DUT port of the first end of the multi-port dual-end differential DUT provides near-end cross talk measurements, (ii) the second differential DUT port of the first end of the multi-port dual-end differential DUT provides reflection measurements, (iii) the third differential DUT port of the second end of the multi-port dual-end differential DUT provides far-end cross talk measurements, and (iv) the fourth differential DUT port of the second end of the multi-port dual-end differential DUT provides attenuation measurements.

In another aspect, a method for measuring S-parameters of a differential device under test (DUT) using a mixed mode vector network analyzer is provided. The method includes steps of: (i) in-phase excitation signals are applied to a first DUT port of the differential DUT and 180° out-phase excitation signals are applied to a second DUT port of the differential DUT using the differential transmitter; (ii) received signals from the first DUT port and second DUT port are measured to calculate a first output signal at a first receiver and a second output signal at a second receiver using a first reflectometer and a second reflectometer; and (iii) a common mode S-parameter and a differential mode S-parameter of the differential DUT is calculated from the first output signal and the second output signal using the first receiver and the second receiver.

In yet another aspect, a method for measuring DC parameter of each conductor of a differential device under test (DUT) using a mixed mode vector network analyzer is provided. The method includes steps of: (i) a first end of a first conductor of the differential DUT is connected to a first DC voltage source; (ii) a first end of a second conductor of the differential DUT is connected to a circuit ground point through a second current meter and a second fixed resistor; (iii) first ends of rest of conductors of the differential DUT is connected to the circuit ground point through a current meter and a fixed resistor; (iv) (a) the second end of the first conductor is connected to a termination point through a third fixed resistor (b) the second end of the second conductor is connected to the termination point through a fourth fixed resistor, (c) the second ends of rest of the conductor is connected to the termination point through a fifth fixed resistor; (v) a current flow in the second conductor and rest of conductors of the differential DUT are measured using the second current meter and the current meter; (vi) the first end of the second conductor of the differential DUT is connected to the second DC voltage source; (vii) the first end of the first conductor of the differential DUT is connected to the circuit ground point through a first current meter and a first fixed resistor; (viii) the first ends of the rest of conductors of the differential DUT is connected to the circuit ground point through the current meter and the fixed resistor; (ix) a current flow in the first conductor and rest of conductors of the differential DUT is measured using the first current meter and the current meter; and (x) an individual resistance of the first conductor and the second conductor is calculated using a computation unit. In one embodiment, the computation unit is configured to solve linear equations of current flow in the first conductor and the second conductor to calculate the individual resistance of the first conductor and the second conductor. In another embodiment, the third fixed resistor, the fourth fixed resistor and the fifth fixed resistor are a fixed reflectometer resistor.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1:
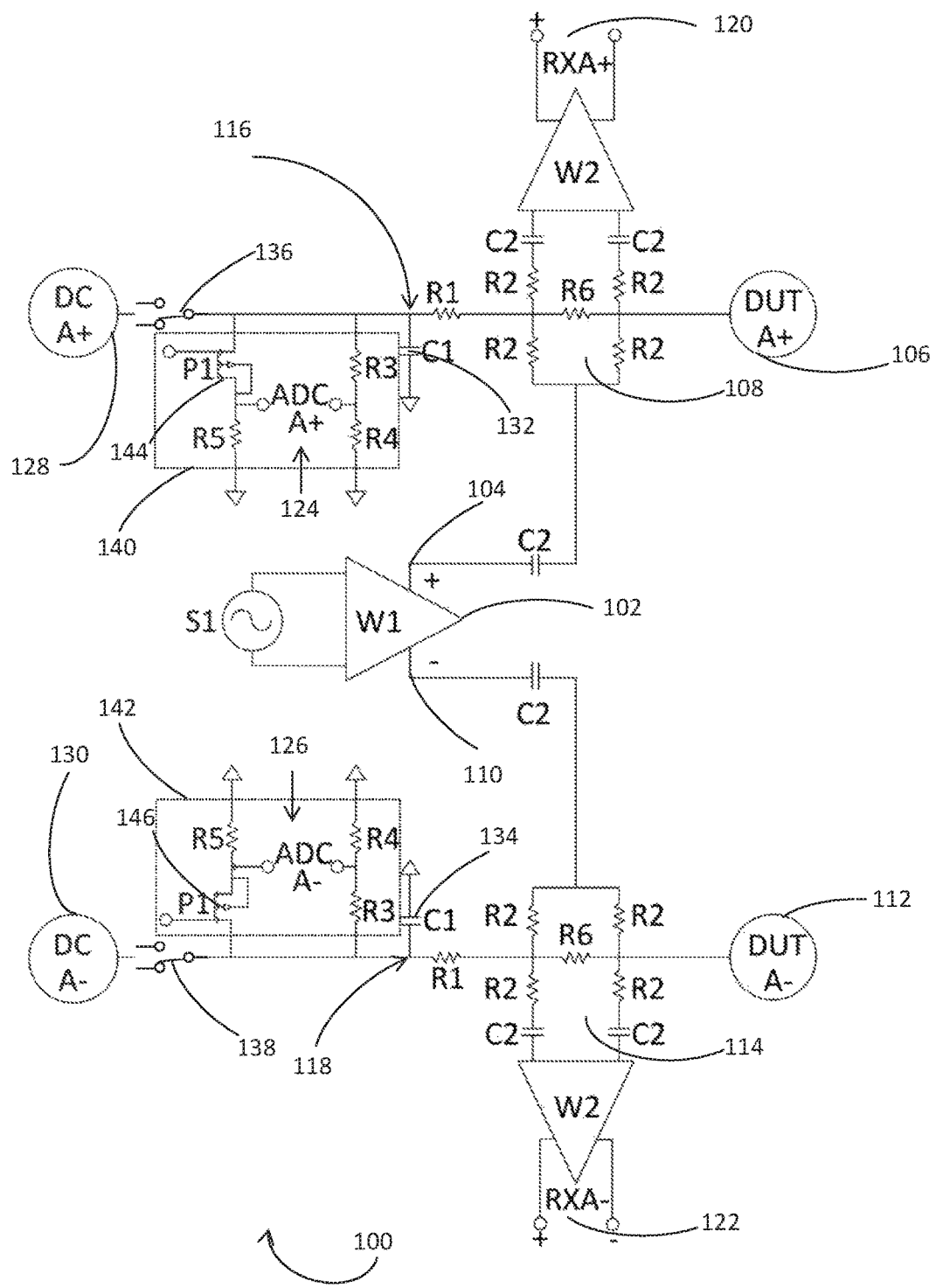
FIG. 1 illustrates a circuit diagram of a mixed mode vector analyzer system to measure S-parameters and DC parameters of a differential device under test (DUT) according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a mixed mode VNA for characterizing balanced DUTs in an accurate, simple, and cost-effective way. The embodiments herein achieve this by providing a mixed mode vector network analyzer system. Referring now to the drawings, and more particularly to FIGS. 1 through 8, where similar reference characters denote corresponding features consistently throughout the figures, there are shown preferred embodiments.

FIG. 1 illustrates a circuit diagram of a mixed mode vector network analyzer system 100 to measure S-parameters and DC parameters of a differential device under test (DUT) according to an embodiment herein. The mixed mode vector network analyzer system 100 includes a differential transmitter 102, a first resistive reflectometer 108, a second resistive reflectometer 114, a first ground port 116, a second ground port 118, a first receiver 120, a second receiver 122, a first DC measurement circuit 140, a second DC measurement circuit 142, a first DC source 128, a second DC source 130, a first coupling capacitor 132, a second coupling capacitor 134, and the differential DUT (not shown in FIG. 1). The differential transmitter 102 further includes a first transmitter port 104, and a second transmitter port 110. The first transmitter port 104 is coupled to a first DUT port 106 of the differential DUT through the first resistive reflectometer 108. The second transmitter port 110 is coupled to a second DUT port 112 through the second resistive reflectometer 114. The first transmitter port 104 is configured to provide in-phase excitation signals to the first DUT port 106. The second transmitter port 110 is configured to provide 180° out-phase excitation signals to the second DUT port 112.

The first ground port 116 of the first resistive reflectometer 108 is connected to the circuit ground point via the first coupling capacitors 132. The second ground port 118 of the second resistive reflectometer 114 is connected to the circuit ground point via the second coupling capacitor 134. In one embodiment, the first ground port 116 and the second ground port 118 is an AC ground. In another embodiment, the first resistive reflectometer 108 and the second resistive reflectometer 114 is a resistive Wheatstone reflectometer bridge. The first receiver 120 is coupled to a measurement port of the first resistive reflectometer 108. The second receiver 122 is coupled to a measurement port of the second resistive reflectometer 114. The first DC measurement circuit 140 includes a first set of resistors R3, R4, R5 and a first current measurement unit (ADC A+) 124, and a first MOSFET 144. The second DC measurement circuit 142 includes a second set of resistors R3, R4, R5 and a second current measurement unit (ADC A−) 126, and a second MOSFET 146. The first DC measurement circuit 140 is coupled to a first switch 136 and the first ground port 116 of the first resistive reflectometer 108. The first switch 136 and the first MOSFET 144 connect either the first DC source 128 or the first current measurement unit 124 that provides low resistance path through a resistor R5 of the first set of resistors to the circuit ground point. The second DC measurement circuit 142 is coupled to a second switch 138 and the second ground port 118 of the second resistive reflectometer 114. The second switch 138 and the second MOSFET 146 connect either to the second DC source 130 or the second current measurement unit 126 that provides low resistance path through a resistor R5 of the second set of resistors to the circuit ground point. In one embodiment, the first DC measurement circuit 140 and the second DC measurement circuit 142 is an ADC. The first DC source 128 and the second DC source 130 are configured to provide DC excitation to the differential DUT. In another embodiment, the differential DUT is twisted pair cables or devices.

The first resistive reflectometer 108 and the second resistive reflectometer 114 are configured to measure S parameters of the differential DUT. The first DC measurement circuit 140 and the second DC measurement circuit 142 are configured to measure DC parameters of the differential DUT. The first resistive reflectometer 108 is configured to provide an output signal, on the first receiver 120, corresponding to a received signal from the first DUT port 106 of the differential DUT. The second resistive reflectometer 114 is configured to provide an output signal, on the second receiver 122, corresponding to a received signal from the second DUT port 112 of the differential DUT. In one embodiment, the output signals on the first receiver 120 and the second receiver 122 are measured concurrently and synchronously. The measurements of the output signal on the first receiver 120 and the second receiver 122 are combined in a vector form using a computing device (not shown in FIG. 1). The computing device is connected to the first receiver 120 and the second receiver 122. A common mode S parameter and differential mode S parameter is calculated using the measurements of the output signal on the first receiver 120 and the second receiver 122. In one embodiment, the first coupling capacitor 132 and the second coupling capacitor 134 provide low enough impedance to even the smallest RF frequency of AC measurement (i.e., measurement of S-parameters) such that the first ground port 116 and the second ground port 118 act like ground point for S-parameters measurements.

The first DC measurement circuit 140 and the second DC measurement circuit 142 are configured to measure resistance of each conductor of the differential DUT. A first end of the each conductor of the differential DUT is connected to a voltage source or a current meter through a switch and second ends of the each conductor of the differential DUT is connected to a common point through a fixed resistor. The first coupling capacitor 132 and the second coupling capacitor 134 are configured to (i) block RF signals from the differential DUT when measuring DC parameters at the first DC measurement circuit 140 and the second DC measurement circuit 142, and (ii) provide ground potential when measuring S parameters at the first receiver 120 and the second receiver 122. For e.g., a coupling capacitor having a capacitance value of 0.1 uF acts like an RF ground for a mixed mode VNA system 100 having smallest RF signal frequency of 1 MHz (offering less than 2 ohm impedance at that frequency) while also causing insignificant measurement error to DC measurement circuit that allows a settling time of about 10 milliseconds after applying a voltage source before making measurement with a current meter.

The first resistive reflectometer 108 and the second resistive reflectometer 114 are configured to provide a conductive path for the DC measurement signals from the first DC voltage source 128 and second DC voltage source 130. The first coupling capacitor 132 and the second coupling capacitor 134 together with the first resistive reflectometer 108 and the second resistive reflectometer 114 enable the measurements of S-parameters and DC parameters without impairing each other.

Figure 2:
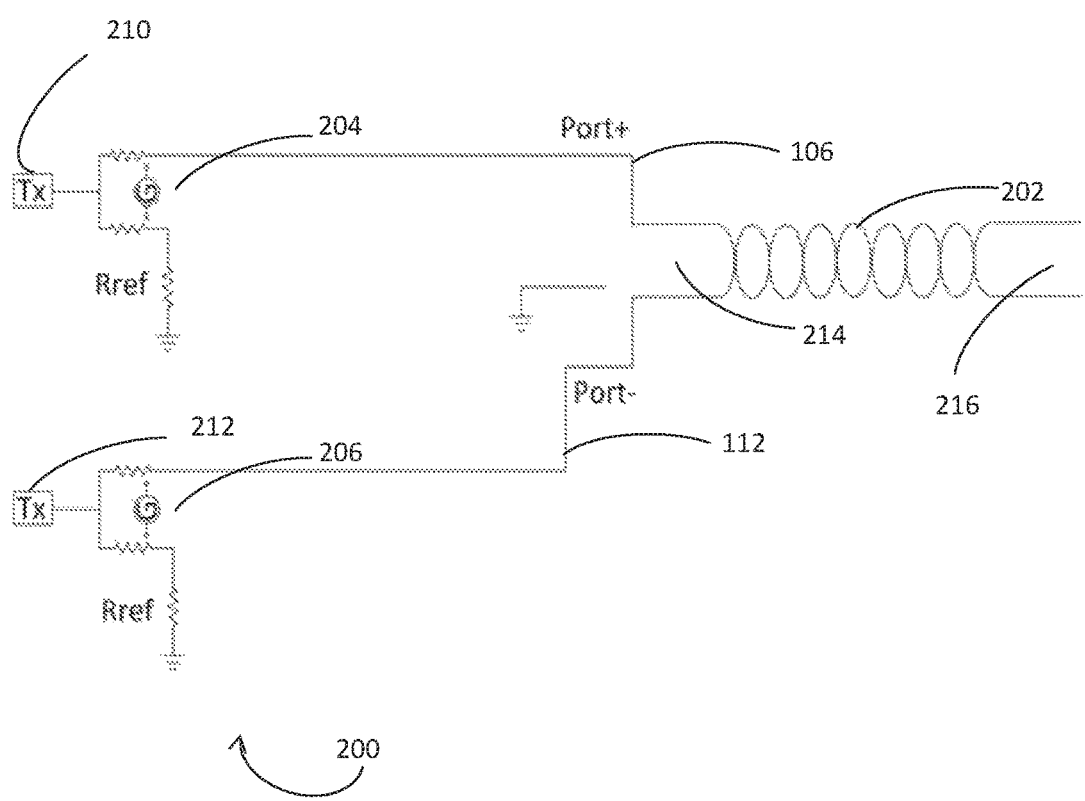
FIG. 2 illustrates a circuit diagram of the mixed mode vector network analyzer system for measuring reflection parameters of the differential DUT in a sequential transmit mode of FIG. 1 according to an embodiment herein.

FIG. 2 illustrates a circuit diagram 200 of the mixed mode vector network analyzer system for measuring reflection parameters of the differential DUT 202 in a sequential transmit mode of FIG. 1 according to an embodiment herein. The circuit diagram 200 includes the differential DUT 202, a first VNA port 204, and a second VNA port 206. The first VNA port 204 is coupled to the first DUT port 106 of the differential DUT 202 and a first transmitter 210. The second VNA port 206 is coupled to the second DUT port 112 of the differential DUT 202 and to a second transmitter 212. The differential DUT 202 includes a first end 214 and a remote second end 216. In one embodiment, the remote second end 216 is not connected to any test device but terminated into characteristic impedance of the DUT (not shown in FIG. 2). A first measurement is measured in the first VNA port 204 when the first transmitter 210 is active and the second transmitter 212 is in termination mode. A second measurement is measured in the second VNA port 206 when the second transmitter 212 is active and the first transmitter 210 is in termination mode. The first measurement and the second measurement are combined to get mixed mode S-parameters of the differential DUT 202. In one embodiment, two measurement cycles are required for measuring mixed mode reflection parameters on one DUT port.

Figure 3:
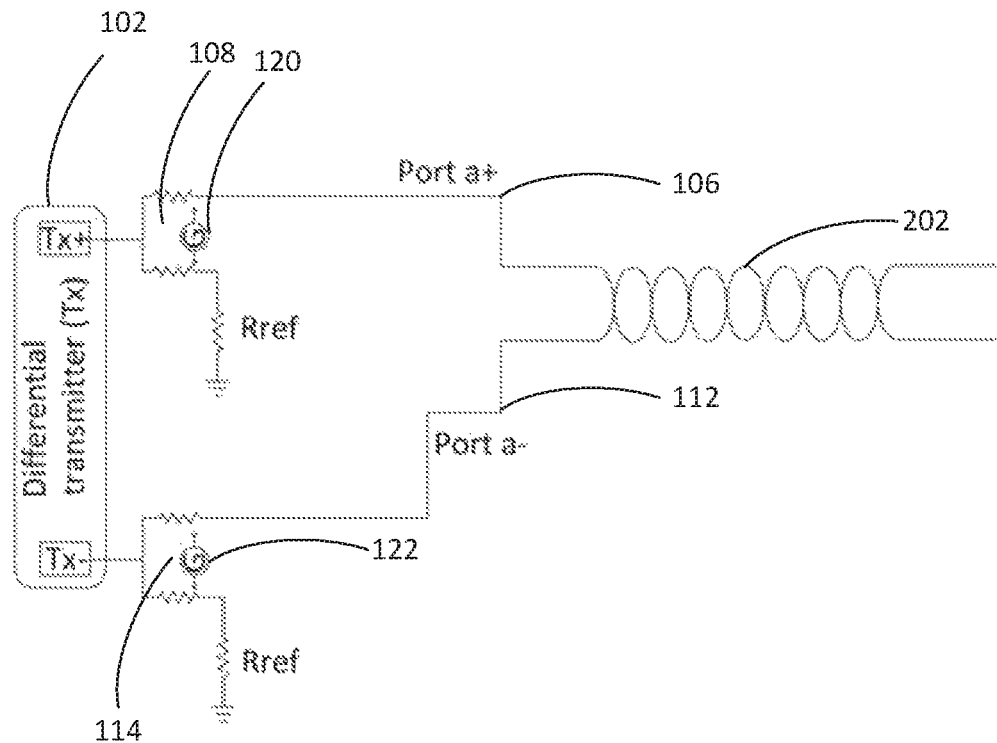
FIG. 3 illustrates a circuit diagram of the mixed mode vector network analyzer system for measuring S-parameters of the differential DUT in differential transmit mode of FIG. 1 according to an embodiment herein.

FIG. 3 illustrates a circuit diagram of the mixed mode vector network analyzer system 100 for measuring S-parameters of the differential DUT 202 in differential transmit mode of FIG. 1 according to an embodiment herein. In one embodiment, the measurements made at first receiver 120 and the second receiver 122 are synchronous, i.e. measured with a common phase reference. In another embodiment, the measurements made at the first receiver 120 and the second receiver 122 are concurrent. In another embodiment, the concurrent measurement provides better noise immunity for differential measurements, as the external noise coupling to the first receiver 120 and the second receiver 122 is similar. The common mode S parameter and differential mode S parameter is calculated using the measurements of the output signal on the first receiver 120 and the second receiver 122. The output signal received at the first receiver 120 is $$S1=S(a+,a+)-S(a+,a-),$$

Where, S1 is the output signal received at the first receiver 120,

S(a+, a+) is the received signal from the first DUT port 106 when the first transmitter port 104 provides in-phase excitation signals to the first DUT port 106, and S(a+, a−) is the received signal from the first DUT port 106 when the second transmitter port 110 provides out-phase excitation signals to the second DUT port 112.

The output signal received at the second receiver 122 is $$S2=S(a-,a+)-S(a-,a-)$$

Where, S2 is the output signal received at the second receiver 122,

S(a−,a+) is the received signal from the second DUT port 112 when the first transmitter port 104 provides in-phase differential excitation signals to the first DUT port 106, S(a−, a−) is the received signal from the second DUT port 112 when the second transmitter port 110 provides out-phase differential excitation signals to the second DUT port 112, and S1, S2, S(a+, a+), S(a+, a−), S(a−,a+), S(a−,a−) are vector quantities having a real part and an imaginary part.

The common mode S-parameter is calculated by adding the output signal received at the first receiver 120 and the output signal received at the second receiver 122. The differential mode S-parameter is calculated by subtracting the output signal received at the second receiver 122 from the output signal received at the first receiver 120.

The common mode S parameter of the differential DUT 202 is calculated by $$S_{CD}(A,A)=0.5[S1+S2],$$

Where $S_{CD}(A,A)$ is the common mode S parameter, more specifically a conversion parameter from the differential mode to the common mode, S1 is the output signal received at the first receiver 120, and
S2 is the output signal received at the second receiver 122.
The differential mode S-parameter of the differential DUT 202 is calculated by:

$$S_{DD}(A,A)=0.5[S1-S2]$$

Where $S_{DD}(A,A)$ is the differential mode S parameter,
S1 is the output signal received at the first receiver 120, and
S2 is the output signal received at the second receiver 122.

Figure 4:
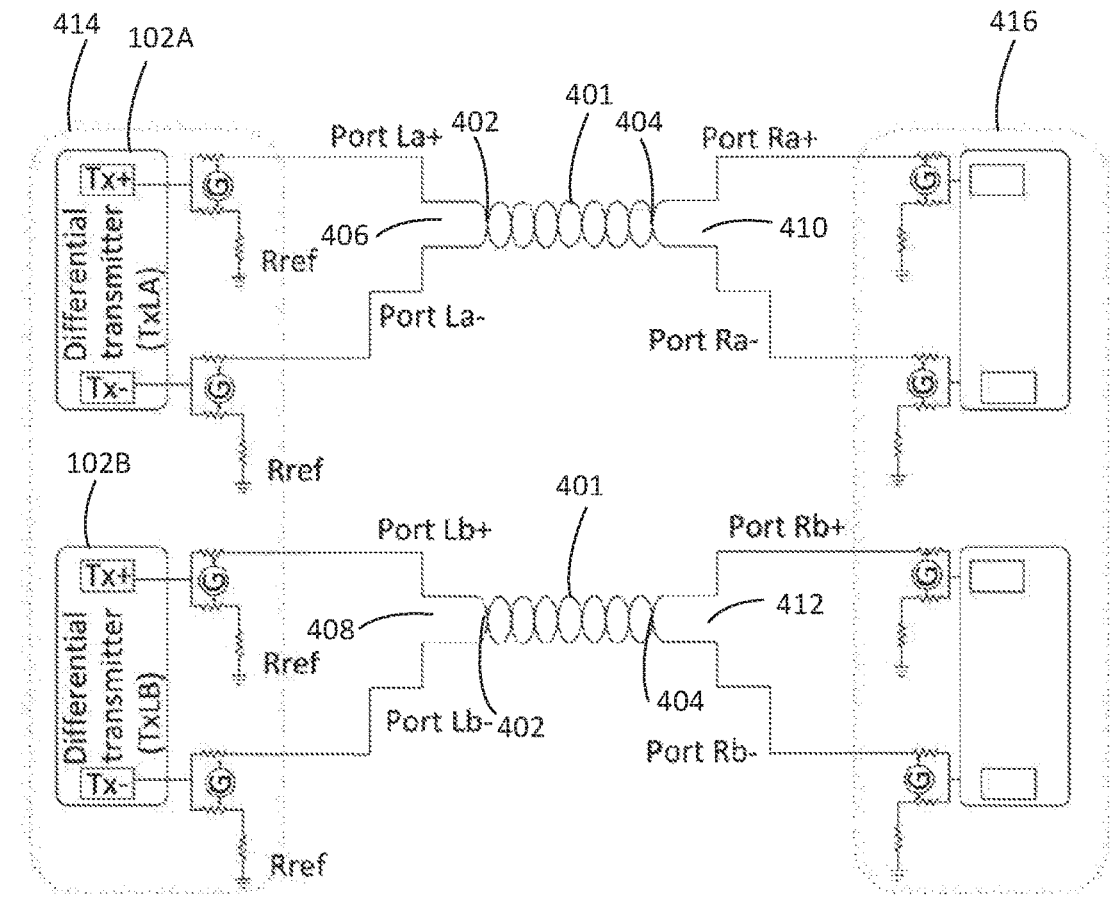
FIG. 4 illustrates a circuit diagram of one or more mixed mode VNA system to measure S-parameters of a multi-port dual-end differential device under test of FIG. 1 according to an embodiment herein.

FIG. 4 illustrates a circuit diagram of one or more mixed mode VNA system to measure S-parameters of a multi-port dual-end differential device under test 401 of FIG. 1 according to an embodiment herein. The multi-port dual-end differential DUT 401 comprises one or more differential ports at a first end 402 and more than one differential port at a second end 404. The first end 402 and the second end 404 are coupled in opposite side of the multi-port dual-end differential DUT 401. In one embodiment, the first end 402 of the multi-port dual-end differential DUT 401 comprises a first differential DUT port 406 and a second differential DUT port 408. In one embodiment, the second end 404 of the multi-port dual-end differential DUT 401 comprises a third differential DUT port 410 and a fourth differential DUT port 412. The first end 402 of the multi-port dual-end differential DUT 401 is coupled to a first mixed mode VNA system 414 to measure S-parameters at the first end 402 of the multi-port dual-end differential DUT 401. The second end 404 of the multi-port dual-end differential DUT 401 is coupled to a second mixed mode vector network analyzer system 416 to measure S-parameters at the second end 404 of the multi-port dual-end differential DUT 401.

When the first differential transmitter 102A provides differential excitation signals to the first differential DUT port 406 of the first end 402, (i) the first differential DUT port 406 of the first end 402 of the multi-port dual-end differential DUT 401 provides reflection measurements, (ii) the second differential DUT port 408 of the first end 402 of the multi-port dual-end differential DUT 401 provides near-end crosstalk measurements, (iii) the third differential DUT port 410 of the second end 404 of the multi-port dual-end differential DUT 401 provides attenuation measurements, and (iv) the fourth differential DUT port 412 of the second end 404 of the multi-port dual-end differential DUT 401 provides far-end crosstalk measurements.

When the second differential transmitter 102B provides differential excitation signals to the second differential DUT port 408 of the first end 402, (i) the first differential DUT port 406 of the first end 402 of the multi-port dual-end differential DUT 401 provides near-end cross talk measurements and (ii) the second differential DUT port 408 of the first end 402 of the multi-port dual-end differential DUT 401 provides reflection measurements, (iii) the third differential DUT port 410 of the second end 404 of the multi-port dual-end differential DUT 401 provides far-end cross talk measurements, and (iv) the fourth differential DUT port 412 of the second end 404 of the multi-port dual-end differential DUT 401 provides attenuation measurements. In one embodiment, the one or more mixed mode VNA system is configured to measure S-parameters and DC parameters of more than two port differential DUT.

Figure 5:
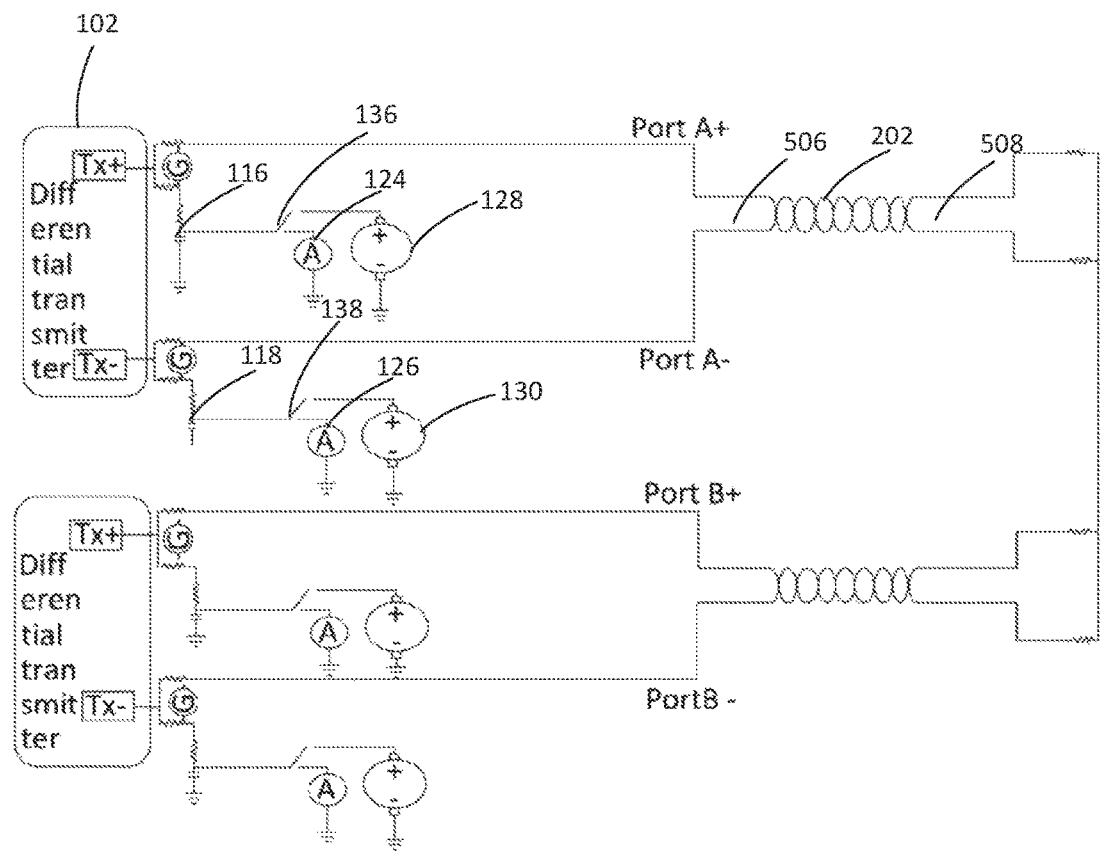
FIG. 5 illustrates a circuit of diagram of the mixed mode VNA system to measure DC parameters of the differential DUT of FIGS. 1,3, and 4 according to an embodiment herein.

FIG. 5 illustrates a circuit diagram of the mixed mode VNA system 100 to measure DC parameters of the differential DUT 202 of FIGS. 1, 3 and 4 according to an embodiment herein. The circuit diagram of the mixed mode VNA system 100 further includes the first current measurement unit 124, the second current measurement unit 126, the first switch 136, and the second switch 138. In one embodiment, the first switch 136 and the second switch 138 is a MOSFET. The first DC measurement circuit 140 is coupled to the first switch 136 and the first ground port 116 of the first resistive reflectometer 108. The first switch 136 either connects to the first DC source 128 or the first current measurement unit 124. The second DC measurement circuit 142 is coupled to the second switch 138 and the second ground port 118 of the second resistive reflectometer 114. The second switch 138 either connects to the second DC source 130 or the second current measurement unit 126. The differential DUT 202 includes a first end 506 and a second end 508. The mixed mode VNA system 100 is connected to the first end 506 of the differential DUT 202. The second end 508 of the differential DUT 202 is connected to a common point via resistors. In an embodiment, a second mixed mode VNA connected to the second end 508 that is configured to provide connection of the conductors of the differential DUT 202 at the second end 508 to a common point via resistors.

Figure 6:
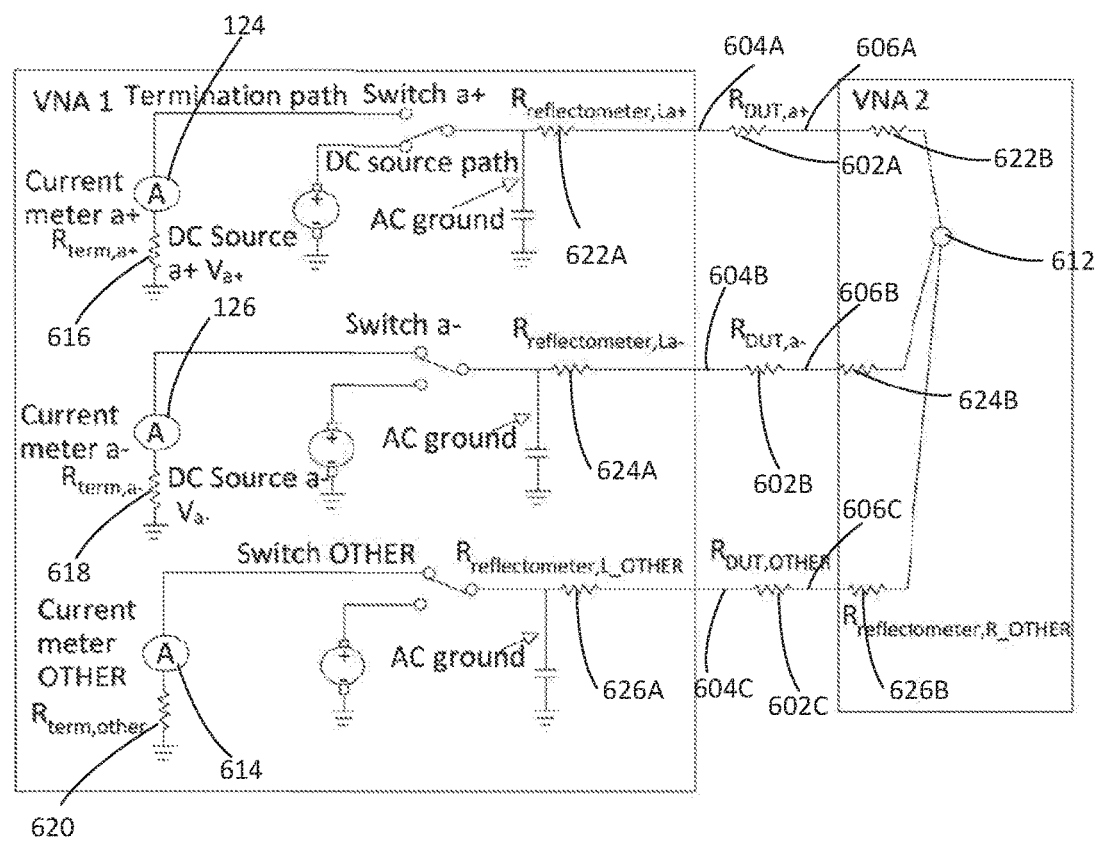
FIG. 6 illustrates a DC equivalent circuit of the mixed mode VNA system to measure DC parameters of the differential DUT of FIG. 5 according to an embodiment herein.

FIG. 6 illustrates a DC equivalent circuit of the mixed mode VNA system 100 to measure DC parameters of the differential DUT 202 of FIG. 5 according to an embodiment herein. In one embodiment, the differential DUT 202 includes at least three conductors. In another embodiment, the differential DUT 202 further includes a first conductor 602A, a second conductor 602B, and rest of the conductors 602C. The first conductor 602A includes a first end 604A, and a second end 606A. The second conductor 602B includes a first end 604B, and a second end 606B. The rest of the conductors 602C include first ends 604C, and second ends 606C.

The first end 604A of the first conductor 602A of the differential DUT 202 is connected to the first DC voltage source 128. The first end 604B of the second conductor 602B of the differential DUT 202 is connected to the circuit ground through the second current measurement unit 126 and a second fixed resistor 618. The first ends 604C of rest of conductors 602C of the differential DUT 202 is connected to the circuit ground point through a current meter 614 and a fixed resistor 620. The second end 606A of the first conductor 602A is connected to a termination point 612 through a third fixed resistor 622B. In one embodiment, the third fixed resistor 622B is a fixed reflectometer resistor. The second end 606B of the second conductor 602B is connected to the termination point 612 through a fourth fixed resistor 624B. In another embodiment, the fourth fixed resistor 624B is a fixed reflectometer resistor. The second ends 606C of rest of the conductor 602C is connected to the termination point 612 through a fifth fixed resistor 626B. In another embodiment, the fifth fixed resistor 626B is a fixed reflectometer resistor. The current flow in the second conductor 602B and rest of conductors 602C, of the differential DUT 202 are measured using the second current measurement unit 126 and the current meter 614. A linear equation for measuring DC parameters when measuring current flow in the second conductor 602B is $$V_{a+} = (R_{a+})(I_{a-} + I_{other1}) + (R_{a-})(I_{a-}) + (R_{term,a-})(I_{a-}),$$

$$R_{a+} = (R_{reflectometer,La+}) + (R_{DUTa+}) + (R_{reflectometer,Ra+}),$$

$$R_{a-} = (R_{reflectometer,La-}) + (R_{DUTa-}) + (R_{reflectometer,Ra-}),$$

Where, Va+ is the voltage applied by the first DC voltage source 128, $R_{a+}$ is an aggregate resistance of the first conductor path comprising the first conductor 602A of the differential DUT 202 and resistances of the first resistive reflectometer 622A and the third fixed resistor 622B (La+ and Ra+ respectively), $R_{a-}$ is an aggregate resistance of the second conductor path comprising the second conductor 602B of the differential DUT 202 and resistances of the second resistive reflectometer 624A and the fourth fixed resistor 624B (La− and Ra− respectively), $R_{term,a-}$ is the resistance of the second fixed resistor 618, $I_{a-}$ is the current measured by the second current measurement unit 126, $I_{other1}$ is the current measured by the current meter 614 when the voltage applied to the first conductor 602A, $(R_{reflectometer,La+})$, $(R_{reflectometer,Ra+})$, $(R_{reflectometer,La-})$ and $(R_{reflectometer,Ra-})$ are the effective DC resistances of the first resistive reflectometers 622A, the third fixed resistor 622B, the second resistive reflectometer 624A and the fourth fixed resistor 624B respectively, and $(R_{DUTa+})$ is the resistance of the conductor 602A and $(R_{DUTa-})$ is the resistance of the conductor 602B of the deferential DUT 202.

The first end 604B of the second conductor 602B of the differential DUT 202 is connected to the second DC voltage source 130. The first end 604A of the first conductor 602A of the differential DUT 202 is connected to the circuit ground through the first current measurement unit 124 and a first fixed resistor 616. The first ends 604C of the rest of conductors 602C of the differential DUT 202 is connected to the circuit ground point through the current meter 614 and the fixed resistor 620. The second end 606A of the first conductor 602A is connected to a termination point 612 through the third fixed resistor 622B. The second end 606B of the second conductor 602B is connected to the termination point 612 through the third fixed resistor 624B. The second ends 606C of rest of the conductor 602C is connected to the termination point 612 through the fifth fixed resistor 626B. The current flow in the first conductor 602A and rest of conductors 602C of the differential DUT 202 is measured using the first current measurement unit 124 and the current meter 614. A linear equation for measuring DC parameters when measuring current flow in the first conductor 602A is $$V_{a-} = (R_{a+})(I_{a+})(R_{a-})(I_{a+}I_{other2}) + (R_{term,a+})I_{a+}$$

$$R_{a+} = (R_{reflectometer,La+}) + (R_{DUTa+}) + (R_{reflectometer,Ra+}),$$

$$R_{a-} = (R_{reflectometer,La-})(R_{DUTa-})(R_{reflectometer,Ra-}),$$

Where, Va− is the voltage applied by the second DC voltage source 130, $R_{a+}$ is an aggregate resistance of the first conductor path comprising the first conductor 602A of the differential DUT 202 and resistances of the first resistive reflectometer 622A and the third fixed resistor 622B (La+ and Ra+ respectively),
$R_{a-}$ is an aggregate resistance of the second conductor path comprising the second conductor 602B of the differential DUT 202 and resistances of the second resistive reflectometer 624A and the fourth fixed resistor 624B (La− and Ra− respectively),
$R_{term,a+}$ is the resistance of the first fixed resistor 616,
$I_{a+}$ is the current measured by the first current measurement unit 124,
$I_{other2}$ is the current measured by the current meter 614 when the voltage applied to the second conductor 602B,
$(R_{reflectometer,La+})$, $(R_{reflectometer,Ra+})$, $(R_{reflectometer,La-})$ and $(R_{reflectometer,Ra-})$ are the effective DC resistances of the first resistive reflectometer 622A, the third fixed resistor 622B, the second resistive reflectometer 624A, and the fourth fixed resistor 624B respectively, and
$(R_{DUTa+})$ is the resistance of the conductor 602A and $(R_{DUTa-})$ is the resistance of the conductor 602B of the deferential DUT 202. Resistance of $(R_{DUTa+})$ and $(R_{DUTa-})$ is set to zero, for example by applying short circuit between 604A and 606A, and between 604B and 606B to measure resistance of $(R_{reflectometer,La+}) + (R_{reflectometer,Ra+})$, $(R_{reflectometer,La-}) + (R_{reflectometer,Ra-})$, $(R_{term,a+})$, and $(R_{term,a-})$.

An individual resistance of the first conductor 602A and the second conductor 602B is calculated by solving both the linear equations using a computation unit (not shown in FIG. 6). In one embodiment, the computation unit is configured to solve linear equations of current flow in the first conductor 602A and the second conductor 602B to calculate the individual resistances $(R_{DUTa+})$ of the first conductor 602A and $(R_{DUTa-})$ of the second conductor 602B.

Figure 7:
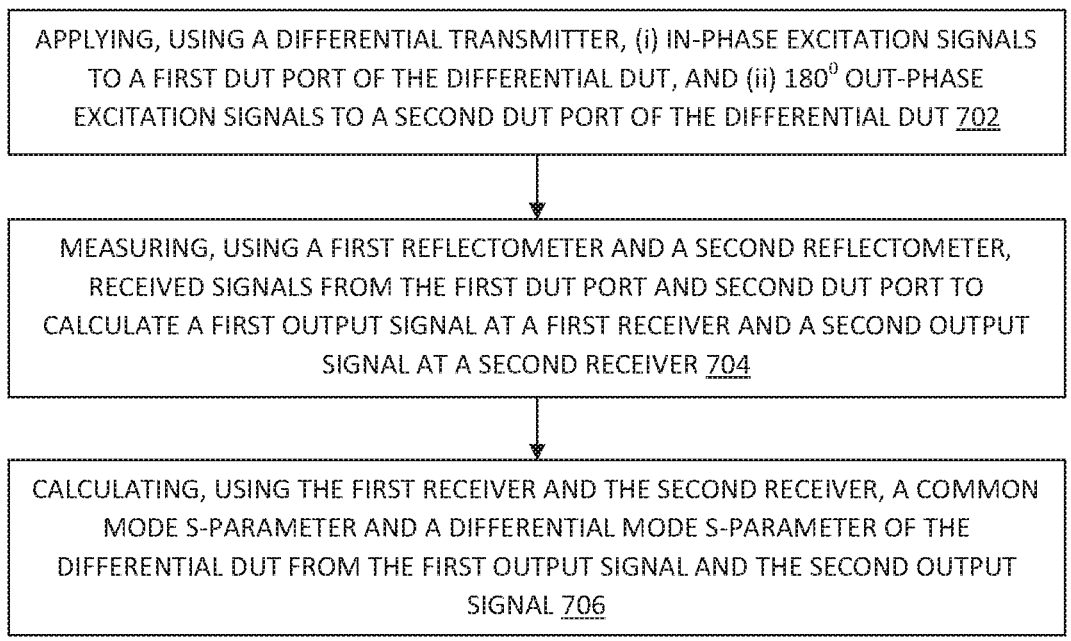
FIG. 7 is a flow diagram illustrating a method for measuring S-parameters of a differential device under test (DUT) using a mixed mode vector network analyzer according to an embodiment herein.

FIG. 7 is a flow diagram 700 illustrating a method for measuring S-parameters of a differential device under test (DUT) 202 using a mixed mode vector network analyzer 100 according to an embodiment herein. The method includes following steps. In step 702, (i) in-phase excitation signals are applied to a first DUT port 106 of the differential DUT 202 and (ii) 180° out-phase excitation signals are applied to a second DUT port 112 of the differential DUT 202 using the differential transmitter 102. In step 704, received signals from the first DUT port 106 and second DUT port 112 are measured to calculate a first output signal at a first receiver 120 and a second output signal at a second receiver 122 using a first resistive reflectometer 108 and a second resistive reflectometer 114. In step 706, a common mode S-parameter and a differential mode S-parameter of the differential DUT 202 is calculated from the first output signal and the second output signal using the first receiver 120 and the second receiver 122.

Figure 8:
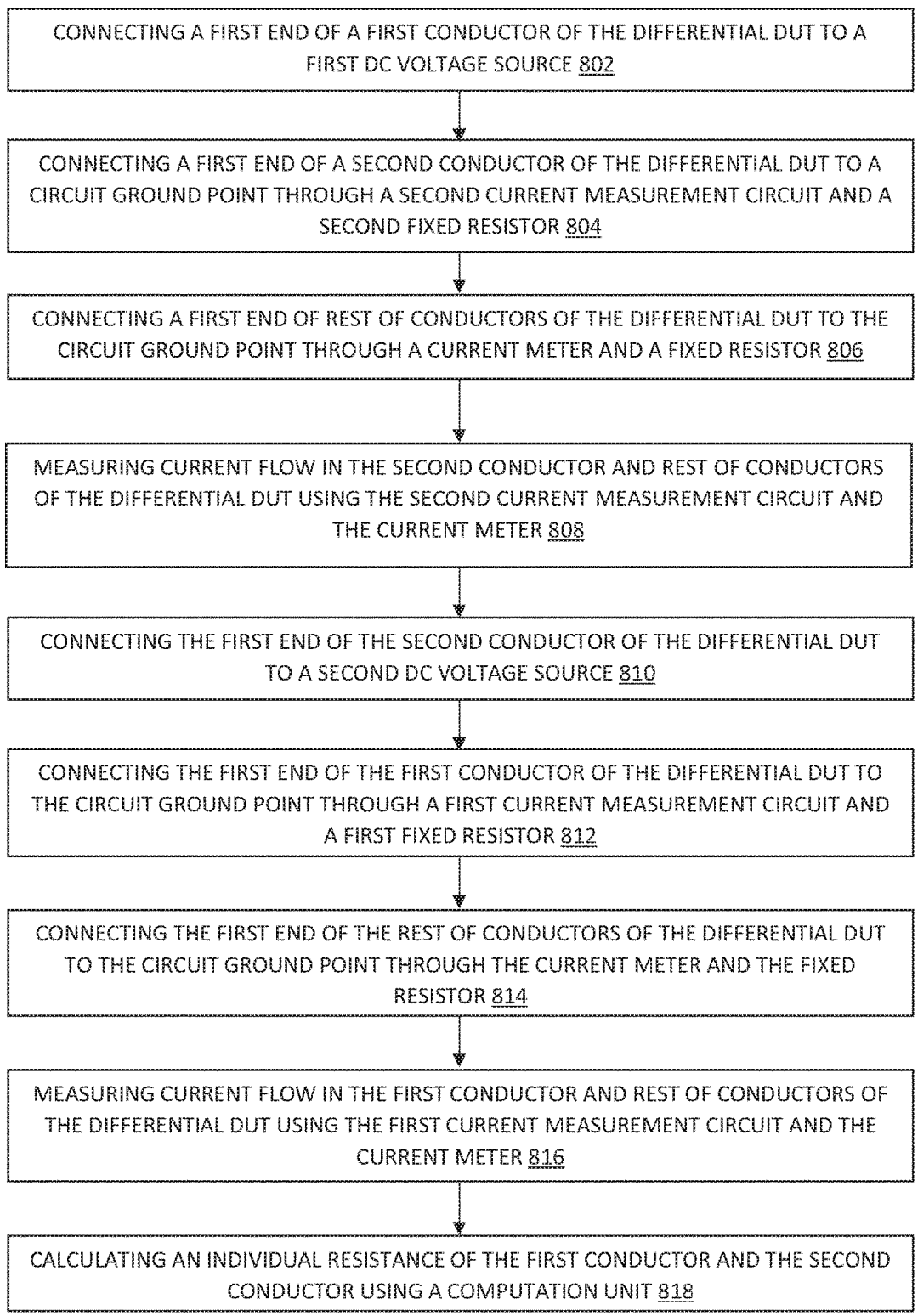
FIG. 8 is a flow diagram illustrating a method for measuring DC parameter of each conductor of a differential device under test (DUT) using a mixed mode vector network analyzer according to an embodiment herein.

FIG. 8 is a flow diagram 800 illustrating a method for measuring DC parameter of each conductor of a differential device under test (DUT) using a mixed mode vector network analyzer according to an embodiment herein. The method includes following steps. In step 802, a first end 604A of a first conductor 602A of the differential DUT 202 is connected to a first DC voltage source 128. In step 804, a first end 604B of a second conductor 602B of the differential DUT 202 is connected to the circuit ground point through a second DC measurement circuit 142 and a second fixed resistor 618. In step 806, first ends 604C of rest of conductors 602C of the differential DUT 202 is connected to the circuit ground point through a current meter 614 and a fixed resistor 620. In step 808, a current flow in the second conductor 602B and rest of conductors 602C of the differential DUT 202 are measured using the second current measurement unit 126 and the current meter 614. In one embodiment, the second end 606A of the first conductor 602A is connected to a termination point 612 through a third fixed resistor 622B. In another embodiment, the second end 606B of the second conductor 602B is connected to the termination point 612 through a fourth fixed resistor 624B. In an embodiment, the second ends 606C of rest of the conductor 602C is connected to the termination point 612 through a fifth fixed resistor 626B. In another embodiment, the third fixed resistor 622B, the fourth fixed resistor 624B and the fifth fixed resistor 626B are a fixed reflectometer resistor. In step 810, the first end 604B of the second conductor 602B of the differential DUT 202 is connected to the second DC voltage source 130. In step 812, the first end 604A of the first conductor 602A of the differential DUT 202 is connected to the circuit ground point through a first current measurement unit 124 and a first fixed resistor 616. In step 814, the first ends 604C of the rest of conductors 602C of the differential DUT 202 is connected to the circuit ground point through the current meter 614 and the fixed resistor 620. In step 816, a current flow in the first conductor 602A and rest of conductors 602C of the differential DUT 202 is measured using the first current measurement unit 124 and the current meter 614. In step 818, an individual resistance of the first conductor and the second conductor is calculated using a computation unit.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A mixed mode vector network analyzer (VNA) system to measure S-parameters and DC parameters of a differential device under test (DUT), wherein the mixed mode vector network analyzer system comprises:
   a differential transmitter that is configured to provide differential excitation signals to the differential DUT, wherein the differential transmitter comprises:
      a first transmitter port that is coupled to a first DUT port of the differential DUT through a first reflectometer, wherein the first transmitter port provides in-phase excitation signals to the first DUT port, wherein a ground port of the first reflectometer is connected to a ground point via a first coupling capacitor; and a second transmitter port that is coupled to a second DUT port of the differential DUT through a second reflectometer, wherein the second transmitter provides 180° out-phase excitation signals to the second DUT port, wherein a ground port of the second reflectometer is connected to a circuit ground point via a second coupling capacitor;

a first receiver that is coupled to a measurement port of the first reflectometer, wherein the first reflectometer is configured to provide an output signal, on the first receiver, corresponding to a received signal from the first DUT port of the differential DUT;

a second receiver that is coupled to a measurement port of the second reflectometer, wherein the second reflectometer is configured to provide an output signal, on the second receiver, corresponding to a received signal from the second DUT port of the differential DUT, wherein the first reflectometer and the second reflectometer are a resistive reflectometer, wherein the output signals on the first receiver and the second receiver are measured concurrently and synchronously;

a first DC measurement circuit connected to the ground port of the first reflectometer; and a second DC measurement circuit connected to the ground port of the second reflectometer.

2. The mixed mode vector network analyzer system of claim 1, wherein the first DC measurement circuit comprises a first switch that either connects to a first DC source or a first current measurement unit that provides low resistance path to the circuit ground point, wherein the second DC measurement circuit comprises a second switch that either connects to a second DC source or a second current measurement unit that provides low resistance path to the circuit ground point.

3. The mixed mode vector network analyzer system of claim 1, wherein the differential DUT is twisted pair cables or devices, wherein the first reflectometer and the second reflectometer is a Wheatstone reflectometer bridge.

4. The mixed mode vector network analyzer system of claim 1, wherein the first receiver and the second receiver is configured to measure S parameters of the differential DUT, wherein the first DC measurement circuit and the second DC measurement circuit is configured to measure DC parameters of the differential DUT.

5. The mixed mode vector network analyzer system of claim 1, wherein the measurements of the output signal on the first receiver and the second receiver are combined in a vector form using a computing device, wherein the computing device is connected to the first receiver and the second receiver.

6. The mixed mode vector network analyzer system of claim 5, wherein a common mode S parameter and differential mode S parameter is calculated using the measurements of the output signal on the first receiver and the second receiver.

7. The mixed mode vector network analyzer system of claim 6, wherein the output signal received at the first receiver is:

$$S1 = S(a+,a+) - S(a+,a-),$$

where, S1 is the output signal received at the first receiver,
S(a+, a+) is the received signal from the first DUT port when the first transmitter port provides in-phase excitation signals to the first DUT port, and S(a+, a−) is the received signal from the first DUT port when the second transmitter port provides out-phase excitation signals to the second DUT port wherein the output signal received at the second receiver is:

$$S2 = S(a-,a+) - S(a-,a-)$$

where, S2 is the output signal received at the second receiver,
S(a−,a+) is the received signal from the second DUT port when the first transmitter port provides in-phase differential excitation signals to the first DUT port, and
S(a−, a−) is the received signal from the second DUT port when the second transmitter port provides out-phase differential excitation signals to the second DUT port.

8. The mixed mode vector network analyzer system of claim 7, wherein the common mode S parameter is calculated by:

$$S_{CD}(A,A) = 0.5[S1 + S2],$$

where $S_{CD}(A,A)$ is the common mode S parameter,
S1 is the output signal received at the first receiver, and
S2 is the output signal received at the second receiver.

9. The mixed mode vector network analyzer system of claim 7, wherein the differential mode S parameter is calculated by:

$$S_{DD}(A,A) = 0.5[S1 - S2],$$

where $S_{DD}(A,A)$ is the differential mode S parameter,
S1 is the output signal received at the first receiver, and
S2 is the output signal received at the second receiver.

10. The mixed mode vector network analyzer system of claim 2,
wherein the first DC measurement circuit and the second DC measurement circuit is configured to measure resistance of each conductor of the differential DUT,
wherein a first end of the each conductor of the differential DUT is connected to a voltage source or a current meter through a switch,
wherein the current meter provides a connection to the circuit ground through a fixed resistor,
wherein the second end of the each conductor of the differential DUT is connected to a common point through a fixed resistor,
wherein the first coupling capacitor and the second coupling capacitor are configured to (i) block RF signals from the differential DUT when measuring DC parameters at the first DC measurement circuit and the second DC measurement circuit, and (ii) provide ground potential when measuring S parameters at the first receiver and the second receiver,
wherein the first resistive reflectometer and the second resistive reflectometer are configured to provide a conductive path for the DC measurement signals,
wherein the first coupling capacitor and the second coupling capacitor together with the first resistive reflectometer and the second resistive reflectometer enable the measurements of S-parameters and DC parameters without impairing each other.

11. The mixed mode vector network analyzer system of claim 1,
wherein one or more mixed mode VNA system is configured to measure S-parameters of a multi-port dual-end differential device under test (DUT),
wherein a multi-port DUT comprises more than one differential port,
wherein a dual-ended DUT comprises a differential port with two ends, wherein the multi-port dual-end differential DUT comprises one or more differential ports at a first end and more than one differential port at a second end, wherein the first end and the second end are coupled in opposite side of the multi-port dual-end differential DUT.

12. The mixed mode vector network analyzer system of claim 11,
wherein the first end of the multi-port dual-end differential DUT comprises a first differential DUT port and a second differential DUT port,
wherein the second end of the multi-port dual-end differential DUT comprises a third differential DUT port and a fourth differential DUT port,
wherein the first end of the multi-port dual-end differential DUT is coupled to a first mixed mode VNA system to measure S-parameters at the first end of the multi-port dual-end differential DUT,
wherein the second end of the multi-port dual-end differential DUT is coupled to a second mixed mode vector network analyzer system to measure S-parameters at the second end of the multi-port dual-end differential DUT,
wherein when the first differential transmitter provides differential excitation signals to the first differential DUT port of the first end, (i) the first differential DUT port of the first end of the multi-port dual-end differential DUT provides reflection measurements, (ii) the second differential DUT port of the first end of the multi-port dual-end differential DUT provides near-end crosstalk measurements, (iii) the third differential DUT port of the second end of the multi-port dual-end differential DUT provides attenuation measurements, and (iv) the fourth differential DUT port of the second end of the multi-port dual-end differential DUT provides far-end crosstalk measurements,
wherein when the second differential transmitter provides differential excitation signals to the second differential DUT port of the first end, (i) the first differential DUT port of the first end of the multi-port dual-end differential DUT provides near-end cross talk measurements, (ii) the second differential DUT port of the first end of the multi-port dual-end differential DUT provides reflection measurements, (iii) the third differential DUT port of the second end of the multi-port dual-end differential DUT provides far-end cross talk measurements, and (iv) the fourth differential DUT port of the second end of the multi-port dual-end differential DUT provides attenuation measurements.

13. A method for measuring S-parameters and DC parameters of a differential device under test (DUT) using a mixed mode vector network analyzer system, wherein the method comprises:
applying, using a differential transmitter, (i) in-phase excitation signals to a first DUT port of the differential DUT, and (ii) 180° out-phase excitation signals to a second DUT port of the differential DUT;
measuring, using a first reflectometer and a second reflectometer, received signals from the first DUT port and second DUT port to calculate a first output signal at a first receiver and a second output signal at a second receiver wherein a ground port of the first reflectometer is connected to a circuit ground point via a first coupling capacitor and wherein a ground port of the second reflectometer is connected to a circuit ground point via a second coupling capacitor;
calculating, using the first receiver and the second receiver, a common mode S-parameter and a differential mode S-parameter of the differential DUT from the first output signal and the second output signal; and
measuring, using a first DC measurement circuit and a second DC measurement circuit, the DC parameters of the differential DUT wherein the first DC measurement circuit is connected to the ground port of the first reflectometer and the second DC measurement circuit is connected to the ground port of the second reflectometer.

14. The method of claim 13,
wherein the common mode S parameter is calculated by:

$$S_{CD}(A,A)=0.5[S1+S2],$$

where $S_{CD}(A,A)$ is the common mode S parameter,
S1 is the first output signal received at the first receiver, and
S2 is the first output signal received at the second receiver,
wherein the differential mode S parameter is calculated by:

$$S_{DD}(A,A)=0.5[S1-S2],$$

where $S_{DD}(A,A)$ is the differential mode S parameter,
S1 is the first output signal received at the first receiver, and
S2 is the first output signal received at the second receiver.

15. The method of claim 13, wherein the first output signal at the first receiver is:

$$S1=S(a+,a+)-S(a+,a-),$$

where, S1 is the first output signal received at the first receiver,
S(a+,a+) is the received signal from the first DUT port when the first transmitter port provides in-phase differential excitation signals to the first DUT port, and
S(a+, a−) is the received signal from the first DUT port when the second transmitter port provides out-phase differential excitation signals to the second DUT port.

16. The method of claim 13, wherein the second output signal at the second receiver is:

$$S2=S(a-,a+)-S(a-,a-)$$

where, S2 is the second output signal received at the second receiver,
S(a−,a+) is the received signal from the second DUT port when the first transmitter port provides in-phase differential excitation signals to the first DUT port, and
S(a−, a−) is the received signal from the second DUT port when the second transmitter port provides out-phase differential excitation signals to the second DUT port.

17. A method for measuring DC parameter of each conductor of a differential device under test (DUT) using a mixed mode vector network analyzer, wherein the method comprises:
connecting a first end of a first conductor of the differential DUT to a first DC voltage source;
connecting a first end of a second conductor of the differential DUT to a circuit ground point through a second current meter and a second fixed resistor;
connecting first ends of rest of conductors of the differential DUT to the circuit ground point through a current meter and a fixed resistor;
connecting (i) a second end of the first conductor to a termination point through a third fixed resistor, (ii) a second end of the second conductor the termination point through a fourth fixed resistor, and (iii) second ends of rest of the conductor to the termination point through a fifth fixed resistor;

measuring current flow in the second conductor and rest of conductors of the differential DUT using the second current meter and the current meter;

connecting the first end of the second conductor of the differential DUT to a second DC voltage source;

connecting the first end of the first conductor of the differential DUT to the circuit ground point through a first current meter and a first fixed resistor;

connecting the first ends of the rest of conductors of the differential DUT to the circuit ground point through the current meter and the fixed resistor;

measuring current flow in the first conductor and rest of conductors of the differential DUT using the first current meter and the current meter; and calculating an individual resistance of the first conductor and the second conductor using a computation unit.

18. The method of claim 17, wherein the computation unit is configured to solve linear equations of current flow in the first conductor and the second conductor to calculate the individual resistance of the first conductor and the second conductor.

19. The method of claim 18, wherein the linear equation when measuring current flow in the second conductor:

$$V_{a+}=(R_{a+})(I_{a-}+I_{other1})+(R_{a-})(I_{a-})+(R_{term,a-})(I_{a-}),$$

where, Va+ is the voltage applied by the first DC voltage source, $R_{a+}$ is an aggregate resistance of the first conductor path comprising the first conductor of the differential DUT and resistances of a first resistive reflectometer and the third fixed resistor connected in the first conductor, $R_{a-}$ is an aggregate resistance of the second conductor path comprising the second conductor of the differential DUT and resistances of a second resistive reflectometer and the fourth fixed resistor connected in the second conductor, $R_{term,a-}$ is the resistance of the second fixed resistor, $I_{a-}$ is the current measured by the second current meter, and $I_{other1}$ is the current measured by the current meter when the voltage applied to the first conductor, wherein $R_{a+}=(R_{reflectometer,La+})+(R_{DUTa+})+(R_{reflectometer,Ra+})$, $R_{a-}=(R_{reflectometer,La-})+(R_{DUTa-})+(R_{reflectometer,Ra-})$, where, $(R_{reflectometer,La+})$, $(R_{reflectometer,Ra+})$, $(R_{reflectometer,La-})$ and $(R_{reflectometer,Ra-})$ are the effective DC resistance of the first resistive reflectometer, the third fixed resistor, the second resistive reflectometer, and the fourth fixed resistor respectively connected in series with the first conductor or the second conductor, and $(R_{DUTa+})$ is the resistance of the first conductor of the deferential DUT and $(R_{DUTa-})$ is the resistance of the second conductor of the deferential DUT, wherein resistance of $(R_{DUTa+})$ and $(R_{DUTa-})$ is set to zero to measure resistance of $(R_{reflectometer,La+})+(R_{reflectometer,Ra+})$, $(R_{reflectometer,La-})+(R_{reflectometer,Ra-})$, $(R_{term,a+})$, $(R_{term,a-})$.

20. The method of claim 18, wherein the linear equation when measuring current flow in the first conductor:

$$V_{a-}=(R_{a+})(I_{a+})+(R_{a-})(I_{a+}+I_{other2})+(R_{term,a+})I_{a+},$$

where, Va− is the voltage applied by the second DC voltage source, $R_{a+}$ is an aggregate resistance of the first conductor path comprising the first conductor of the differential DUT and resistances of the first resistive reflectometer, and the third fixed resistor connected in the first conductor, $R_{a-}$ is an aggregate resistance of the second conductor path comprising the second conductor of the differential DUT and resistances of the second resistive reflectometer and the fourth fixed resistor connected in the second conductor, $R_{term,a+}$ is the resistance of the first fixed resistor, $I_{a+}$ is the current measured by the first current meter, and $I_{other2}$ is the current measured by the current meter when the voltage applied to the second conductor, wherein $R_{a+}=(R_{reflectometer,La+})+(R_{DUTa+})+(R_{reflectometer,Ra+})$, $R_{a-}=(R_{reflectometer,La-})+(R_{DUTa-})+(R_{reflectometer,Ra-})$, where, $(R_{reflectometer,La+})$, $(R_{refleetometer,Ra+})$, $(R_{reflectometer,La-})$ and $(R_{reflectometer,Ra-})$ are the effective DC resistance of the first resistive reflectometer, the third fixed resistor, the second resistive reflectometer, and the fourth fixed resistor respectively connected in series with the first conductor or the second conductor, and $(R_{DUTa+})$ is the resistance of the first conductor of the differential DUT and $(R_{DUTa-})$ is the resistance of the second conductor of the deferential DUT, wherein resistance of $(R_{DUTa+})$ and $(R_{DUTa-})$ is set to zero to measure resistance of $(R_{reflectometer,La+})+(R_{reflectometer,Ra+})$, $(R_{reflectometer,La-})+(R_{reflectometer,Ra-})$, $(R_{term,a+})$, and $(R_{term,a-})$, wherein the resistance of the first conductor $(R_{a+})$ and second conductor $(R_{a-})$ of the differential DUT is calculated by solving the linear equations ($V_{a+}$ and $V_{a-}$).

* * * * *